(12) United States Patent
Fang et al.

(10) Patent No.: US 7,018,861 B2
(45) Date of Patent: Mar. 28, 2006

(54) METHOD OF MANUFACTURING INTEGRATED SEMICONDUCTOR DEVICES AND RELATED DEVICES

(75) Inventors: Ruiyu Fang, Turin (IT); Marzia Rosso, Turin (IT); Simone Codato, Turin (IT); Cesare Rigo, Turin (IT)

(73) Assignee: Agilent Technologies, Inc., Palo Alto, CA (US)

(*) Notice: Subject to any disclaimer, the term of this patent is extended or adjusted under 35 U.S.C. 154(b) by 92 days.

(21) Appl. No.: 10/350,611

(22) Filed: Jan. 24, 2003

(65) Prior Publication Data

US 2004/0146236 A1    Jul. 29, 2004

(51) Int. Cl.
*H01L 21/00* (2006.01)

(52) U.S. Cl. .......................... 438/31; 438/46

(58) Field of Classification Search ............... 438/31, 438/46–47, 21
See application file for complete search history.

(56) References Cited

U.S. PATENT DOCUMENTS

| | | | |
|---|---|---|---|
| 5,728,215 A | 3/1998 | Itagaki et al. ............... 117/104 |
| 6,180,429 B1* | 1/2001 | Anselm et al. ............... 438/22 |
| 6,277,663 B1* | 8/2001 | Matsumoto et al. .......... 438/22 |
| 2001/0031514 A1* | 10/2001 | Smith .......................... 438/107 |
| 2002/0094594 A1* | 7/2002 | Kim et al. .................... 438/30 |

OTHER PUBLICATIONS

"Etching Of InP-Based MQW Laser Structure In A MOCVD Reactor By Chlorinated Compounds", Bertone et al., Journal of Crystal Growth 195, pp. 624-629.

* cited by examiner

*Primary Examiner*—Richard A. Booth

(57) ABSTRACT

Integrated semiconductor devices are manufactured by providing a layered semiconductor structure having an exposed surface and providing a mask on the exposed surface thereby defining a masked region in the layered structure underneath said mask. The mask has a main direction of extension with a width across the main direction and an end portion. The layered structure is etched over a given depth starting from the exposed surface, whereby the masked region is left substantially unaffected by the etching process and has an end surface extending underneath the end portion of the mask. A further layered semiconductor structure is grown around the masked region to produce an integrated layered semiconductor structure having at the end surface an interface between the layered structure and the further grown structure. The mask width is selected to be less than 50 microns.

34 Claims, 5 Drawing Sheets

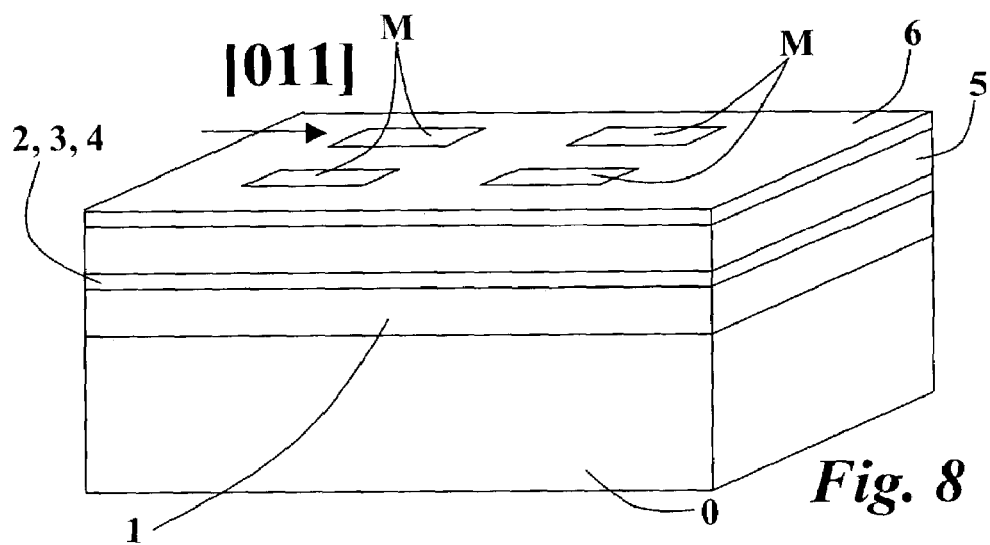
*Fig. 8*
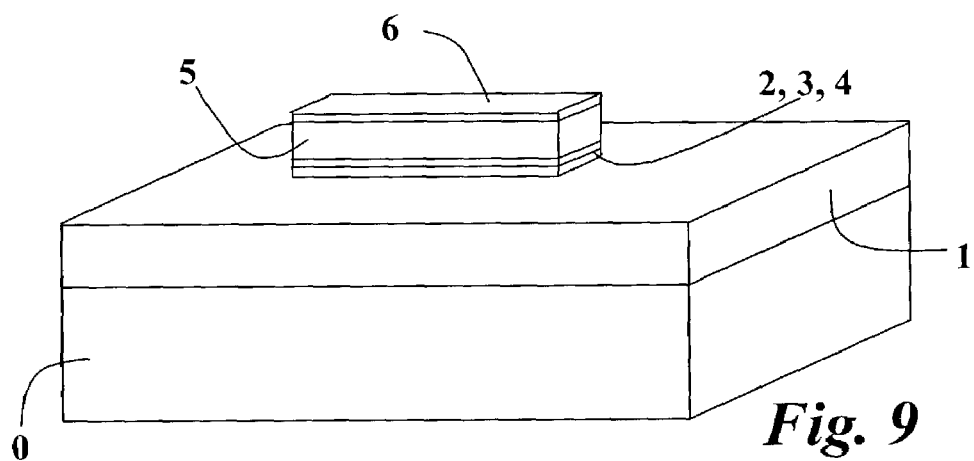
*Fig. 9*
*Fig. 10*
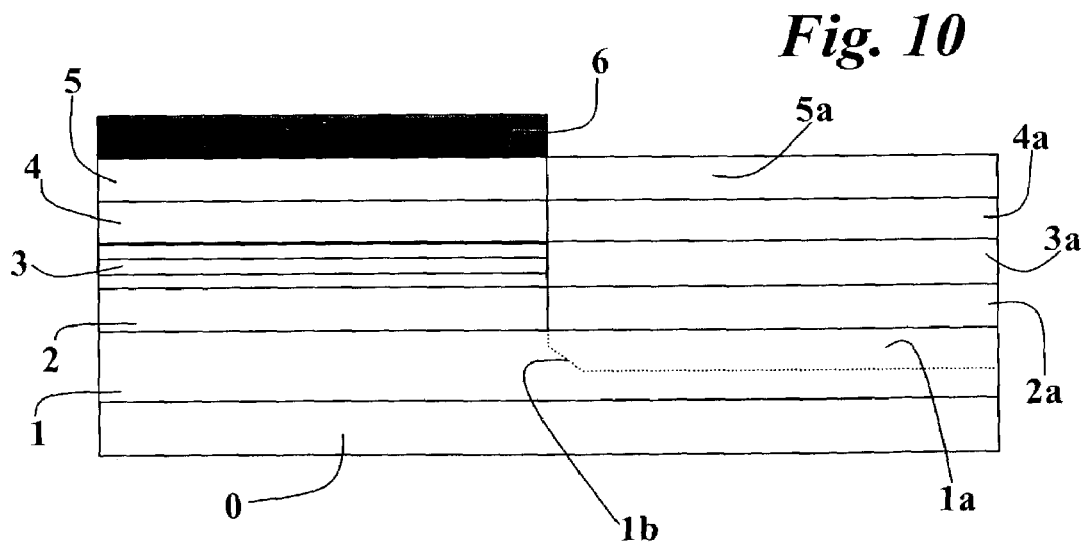

METHOD OF MANUFACTURING INTEGRATED SEMICONDUCTOR DEVICES AND RELATED DEVICES

FIELD OF THE INVENTION

The invention relates to methods of manufacturing integrated semiconductor devices.

The invention was developed by paying specific attention to the possible use in manufacturing so-called "multifunctional" integrated opto-electronic devices. Sophisticated InP-based optical sources integrating an active laser region with a passive waveguide adapted for wide range wavelength-tunable applications or with a passive modulator for low-chirp modulation are exemplary of such devices.

DESCRIPTION OF THE RELATED ART

Development of truly satisfactory integrated semiconductor devices of the kind referred to in the foregoing requires the availability of growth/re-growth technologies leading to very small radiation losses and high coupling efficiency. These results must be achieved without adversely affecting operation of the various elements such as active/passive waveguides that are integrated.

Integrated InP-based optical components have been recently produced by means of selective area growth (SAG) or butt-coupling growth (or joint-junction) techniques based on standard growth technologies such as MOCVD (Metal Oxide Chemical Vapor Deposition) or MBE (Molecular Beam Epitaxy).

The main disadvantage of the SAG technique (as disclosed i.a. in U.S. Pat. No. 5,728,215 to Takushi Itagaki et al.) lies in the wide band-gap transition between the two adjacent regions and the intrinsic limitations related to the fact that separately optimising the design for both waveguides is in fact impossible. In practice, only bulk material to bulk material or MQW to MQW matching is feasible. Also, no changes in the structure or MQW stack number are possible between the two waveguides.

An alternative technique that enables the active and the passive waveguides to be optimised separately is based on butt-coupling growth. However, surface migration effects from the mask, that give rise to thickness and composition non-uniformity near the edge of the mask cannot be dispensed with. Furthermore, if the mask dimension is longer than the diffusion length of the growth species, deposition of polycrystals on the mask surface occurs, which in turn leads to low yields in device processing.

In order to improve the growth quality near the mask when using a butt-coupling technique, fairly sophisticated growth sources (for example, Cl-containing growth sources) have been proposed to increase the species diffusion length. Exemplary of this approach is the article "Etching of InP-based MQW laser structure in a MOCVD reactor by chlorinated compounds" by D. Bertone, R. Campi, and G. Morello, *Journal of Crystal Growth*, 195 (1998) 624–629.

OBJECTS AND SUMMARY OF THE INVENTION

An object of the invention is thus to provide an improved method of manufacturing integrated opto-electronic devices while reducing surface migration effects from the mask thus minimizing thickness and composition variations near the edge of the mask.

Another object of the invention is to provide an improved, simple and cost-effective method of manufacturing integrated opto-electronic devices exhibiting plural functions such as the integration of an active region with a passive waveguide.

A further object of invention is to provide a method for manufacturing sophisticated laser sources such as InP-based laser sources integrated with a passive waveguide adapted for wide range wavelength tunable applications and/or a passive modulator, such as a passive modulator for low-chirp modulation.

Another further object of the invention is to facilitate integration of different semiconductor waveguides (active-active, active-passive, or passive-passive) by means of an improved growth technology while minimising radiation losses and ensuring high coupling efficiency without adversely affecting the operational and functionality of the waveguides.

A further object of the invention is to provide an improved butt-coupling growth technology enabling both an active an a passive optical waveguide to be integrated and optimised separately, while also making it possible to change the material structure or the MQW stack numbers.

Still another further object of the invention is to provide an improved method of manufacturing integrated semiconductor devices such as opto-electronic devices while avoiding deposition of polycrystals on the mask surface, thus ensuring high yields in device processing without having to resort to sophisticated growth sources.

In fulfilling the objects above, the invention provides a solution adapted for ensuring thoroughly satisfactory butt-coupling growth with planar surfaces while using conventional MOCVD growth conditions for integrated components such as optical components, for instance on an InP substrate. Advantageously, the invention makes use of conventional technologies for III–V materials (such as InP-based materials) while achieving substantial improvements in terms of both process cost and yield.

The presently preferred embodiment the invention provides a butt-coupling growth technique based on a new mask design. Instead of resorting to sophisticated growth sources, the invention primarily aims at optimising mask geometry while reducing the mask area in order to minimise surface migration effects from the mask surface and any adverse effect on the gas phase flow related to the presence of the mask on the growth surface. Furthermore, the technology steps are optimised by a combination of mesa profile (i.e. obtained by dry-etch and wet chemical etch) and growth parameters (mainly buffer layer thickness) to guarantee a quasi-planar surface while maintaining high material quality.

Generally, a sensible compromise must be reached in order to allow sufficient margin for alignment to tolerance thus ensuring easy processing. In addition, polycrystal deposition on the mask surface is avoided primarily as a result of mask geometry design rather than by altering the species diffusion length.

A preferred embodiment of the invention is a method of manufacturing integrated semiconductor devices, including the steps of providing a layered semiconductor structure having an exposed surface, and providing a mask on said exposed surface thereby defining a masked region of said layered structure underneath said mask. The mask has a main direction of extension with a width across said main direction and an end portion. The layered structure is then etched over a given depth starting from the exposed surface, whereby the masked region is left substantially unaffected by the etching and has an end surface extending underneath said end portion. A further layered semiconductor structure is grown around the masked region to produce an integrated layered semiconductor structure having at said end surface an interface between said layered structure and the further grown structure.

The mask width is selected to be less than 50 microns, preferably less than 30 microns, and still preferably less than 20 microns. In a particularly preferred embodiment the mask width is selected to be less than 15 microns. Preferably the mask width is selected to be more than 1 micron, and still preferably more than 3 microns. Particularly preferred embodiments provide for the mask width to be more than 5 microns, and still preferably more than 8 microns. The presently preferred embodiment of the invention provides for the mask width to be selected in the range between 8 and 15 microns.

Preferably the mask is a dielectric mask, such as a $SiO_2$ mask.

An embodiment of the invention includes the step of providing over the exposed surface a plurality of masks thus defining respective masked regions of said layered structure underneath the masks of said plurality. Two adjacent masks in said plurality have a lateral separation length or pitch and such separation length is selected to be substantially equal to 200 microns or higher.

In an embodiment of the invention, the layered structure includes a base buffer layer opposed said exposed surface and the etching is extended from said exposed surface within said buffer layer, preferably by providing a smooth growth surface at said buffer layer.

Preferably, the etching is a combination of a reactive ion etching (RIE) and a wet chemical etch (WCE) such as a reactive ion etching followed by a mild chemical etch e.g. of less than two minutes. A preferred choice for the wet chemical etch is a chemical etch providing a nearly vertical sidewall, such as e.g. a 2:1:1:1 ($CH_3COOH$, $H_2O$, $H_2O_2$, HCl) 2', 10C etch.

A preferred embodiment of the invention is an integrated semiconductor device including a first layered structure and a second layered structure, the first and second layered structures having an interface therebetween, wherein said second layered structure is a grown layered structure and the interface is a reduced transition interface. The second layered structure may or may not include a buffer layer.

In an embodiment of the invention, the first layered structure includes at least one active lasing layer and the second layered structure includes an optical waveguide coupled with said at least one lasing layer. The at least one lasing layer may comprise a laser source of the group consisting of an InP-based laser source and a GaAs-based laser source. The optical waveguide may comprise at least one of a wide range wavelength tunable waveguide and a passive modulator.

BRIEF DESCRIPTION OF THE SEVERAL VIEWS OF THE DRAWINGS

Embodiments of the present invention will now be described, purely by way of non-limiting examples, with reference to the attached drawings, in which:

FIG. 8 shows a butt-coupling mask definition step within the same process, FIG. 9 shows a butt-coupling mesa etching step in the same process, FIG. 10 shows, in substantial similarity to FIG. 5, the result of a butt-coupling passive waveguide growth process according to the invention.

DETAILED DESCRIPTION OF PREFERRED EMBODIMENTS OF THE INVENTION

Embodiments of a method of manufacturing integrated semiconductor devices and related devices are described herein. In the following description, numerous specific details are given to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
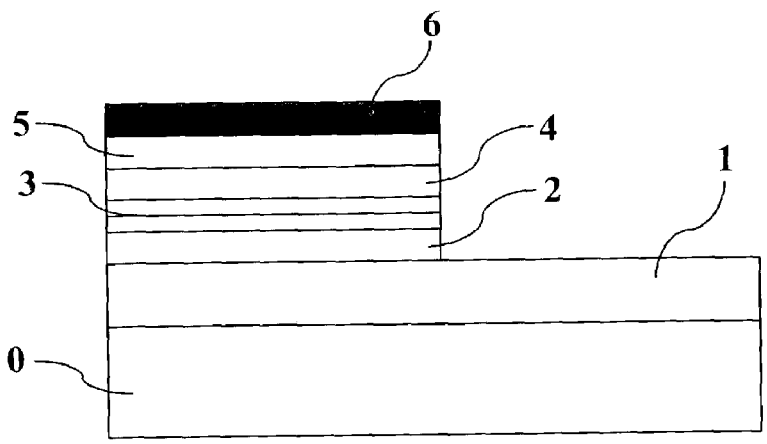
FIGS. 1 to 3 schematically show three different butt-coupling etching profiles.
Figure 2:
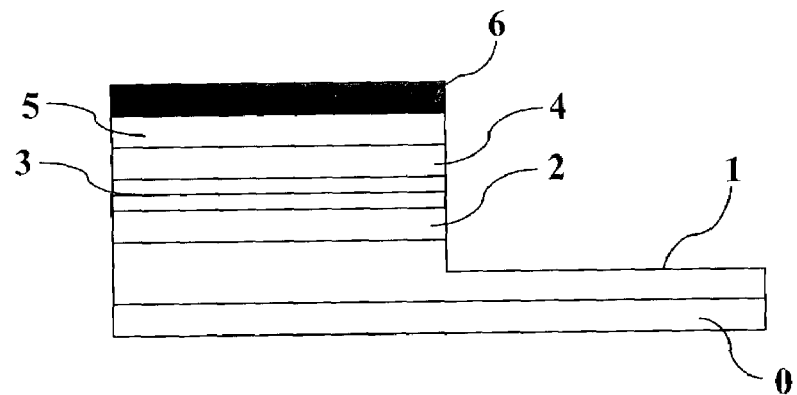
Figure 3:
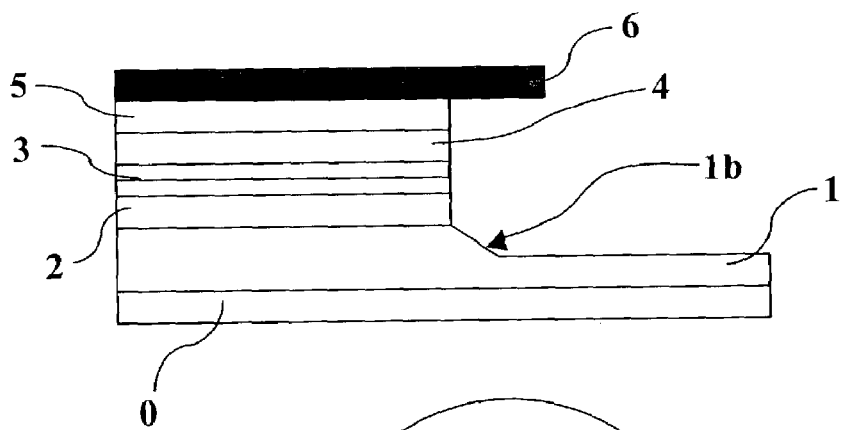

FIGS. 1 to 3 show three different etching profiles that were prepared in order to study the influence of the nature of the exposed surface and the regrowth profile in samples of a layered structure for use in manufacturing integrated semiconductor opto-electronic devices.

Specifically, the structures investigated include, starting from the bottom to the top of FIGS. 1 to 3:

an InP: n-doped buffer layer 1 on a n-doped substrate 0;
a first quaternary InGaAsP SCH layer 2;
a conventional multi quantum well (MQW) DFB or SOA active layer 3;
another quaternary InGaAsP SCH layer 4, substantially identical to layer 2; and
a further InP Layer 5 over which an etch mask 6 was provided.

The mask in question has a main direction of extension (essentially in the plane of the drawing of FIGS. 1 to 3) with a width across said main direction and an end portion.

The butt-coupling patterns described in greater detail in the following can be obtained by standard photolithography techniques by using a dielectric 250 nm $SiO_2$ film mask.

The mask width ranges from 5 to 50 microns with the total length exceeding 700 microns. The lateral pitch is 200 microns while the longitudinal pitch is 1050 microns.

The sample shown in FIG. 1 is the result of etching the sample via reactive ion etching (RIE) throughout the active layer stopping the etch at the interface with the underlying InP:n buffer layer 1. The result shown in FIG. 1 represents the simplest technological approach and can be chosen as a reference point.

The profile shown in FIG. 2 was again prepared via RIE etching the sample while ending the RIE process at about 200 nm within the InP:n buffer 1. In that way a buffer layer can be grown before the growth of the active region of a modulator in order to smooth and restore any microscopic damage induced by RIE etching.

The profile shown in FIG. 3 was obtained by a combination of RIE and wet chemical etch (WCE) in order to obtain both an under-etch at the lateral side and at the end portion of the $SiO_2$ mask 6 and a smooth regrowth surface 1b at the buffer layer 1. Specifically, etching was continued down to 200 nm into the InP:n buffer layer.

The etching solution provides a vertical sidewall, together with a smooth lateral surface and a small undercut underneath the dielectric mask film.

The RIE etching conditions for the dielectric film and semiconductor material are those currently adopted in conventional processes.

Figure 4:
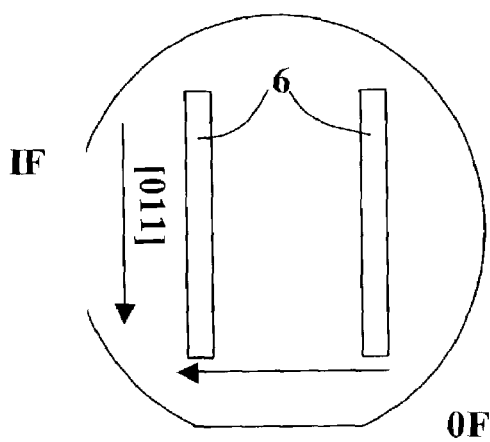
FIG. 4 shows an exemplary mask orientation used carrying out the etching processes shown in FIGS. 1 to 3.

The masks 6 were oriented as shown in FIG. 4, in order to form a butt-coupling interface parallel to the outer flat (OF) of the semiconductor.

The samples shown in FIGS. 1 to 3 were subsequently subjected to regrowth in order to produce a regrown structure chosen as a sequence of materials optimized for modulator performance.

Figure 5:
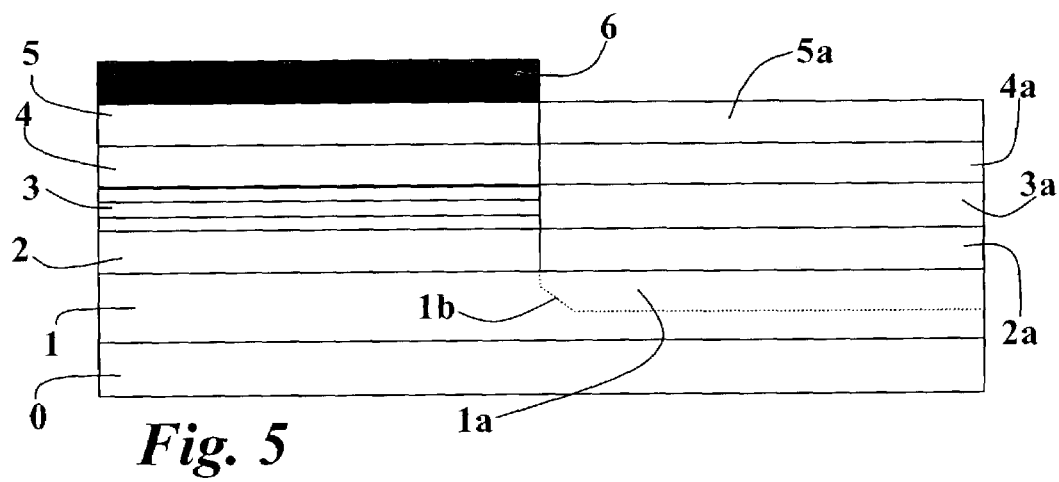
FIG. 5 shows a re-growth step being carried out after one of the etching step considered in FIGS. 1 to 3.

Specifically, in FIG. 5 the following regrown layers are shown:

an n-InP buffer layer 1a;
a first SCH lattice matched layer 2a of InGaAsP;
a stacked MQW sequence 3a for a modulator device;
a second repetition of SCH 2a, designated 4a; and
a further p-InP2 layer designated 5a.

Due to the reduced mask effects, all these layers can be grown under conventional MOCVD conditions.

In order to check the influence of mask dimensions and processing technology two main factors are to be investigated: the overgrowth enhancement and the photoluminescence emission shift (PL shift) at the butt-joint transition region.

Overgrowth was found to be greatly influenced by the mask width. The additional flow due to the presence of masked areas appreciably perturbs the interface region. Mask widths ranging from 5 to 50 microns provide acceptable interface quality in terms of morphological and optical properties. Also, the mask width must be compatible with technological requirements.

Within the range of possible mask widths the wavelength shift was also found to be strongly reduced. Optical transition region, where PL deviations from the reference unperturbed region are observed, is limited in its extension being typically less than 30 microns (for a PL shift of 10 nm) for masks wider than 10 microns. For reduced width masks (5–15 microns), the transition region is within a few microns well suited for the butt joint integration.

Experiments carried out by the applicants show that 50 microns represent a preferred upper bound for the mask width, still preferable values being less than 30 microns, and still more preferably less than 20 microns. Particularly preferred results are obtained when the mask width is selected to be less than 15 microns.

As regards the lower bound, the mask width is preferably selected to be more than 1 micron, and still preferably more than 3 microns. Particularly preferred embodiments provide for the mask width to be more than 5 microns, and still preferably more than 8 microns. The presently known best mode of carrying out the invention provides for the mask width to be selected in the range between 8 and 15 microns.

A strong relationship between the regrowth profile and the etch profile has been observed. In particular, an almost vertical and smooth sidewall with a lateral undercut (FIG. 3) of less than 0.5 microns is the preferred pre-growth profile. It will be appreciated that in FIG. 3 of the drawing, the dimensions of such an undercut were exaggerated for the sake of presentation.

In order to obtain such a profile a combination of dry RIE etch followed by a mild chemical etch not disturbing the verticality of the side-wall formed beneath the end portion of the mask may be selected.

Another significant factor for high quality butt-joint regrowth is represented by the thickness of the n-InP buffer 1a. The buffer layer thickness should be thin enough not to disturb the growth behaviour with the development of vicinal faces, and sufficiently thick to restore the surface quality by isolating the defects from the substrate. The buffer thickness has been determined by optimisation of the photoluminescence yield of the regrown material. The chosen value lies in a range between about 100 and about 200 nanometers.

Figure 6:
FIG. 6 shows an exemplary mask design for butt-coupling growth.

FIG. 6 shows various mask arrangements for butt-coupling growth.

A typical value for the distance Lp separating two masks is 350 microns. In the embodiment shown the mask has a length La of 700 microns, the spacing between adjacent pairs of masks Lc being of the order of 200 microns. In FIG. 6 the mask width Lm has a value from 5 to 50 microns.

Figure 7:
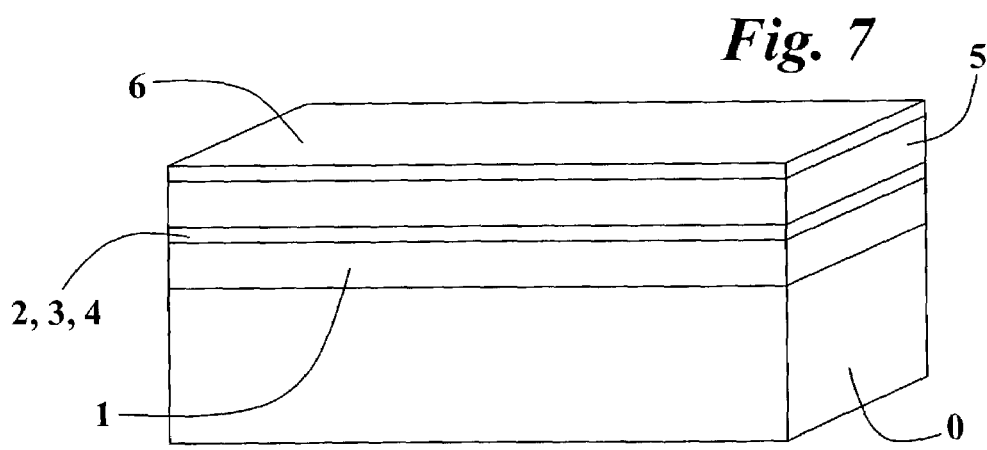
FIG. 7 shows a first step in a process for manufacturing an integrated opto-electronic device according to the invention.

FIGS. 7 to 9 schematically show the three first basic steps in manufacturing an integrated opto-electronic device using the method of the invention.

FIG. 7 shows as a starting block a laser gain section comprised of layers 1 to 6 already discussed with reference to FIGS. 1 to 3. It will be appreciated to that in the schematic views of FIGS. 7 to 9 the combined MQW active layers 2, 3, 4 are shown as a single layer.

FIG. 8 shows the butt-coupling mask definition step leading to a plurality of masks, generally designated M, being provided as the dielectric mask layer 6. FIG. 8 also shows such masks M having their major direction of extension (indicated by an arrow in FIG. 8) aligned with the [011] crystal direction.

FIG. 9 shows the effect of etching the structure of FIG. 8 leading to a butt-coupling mesa profile. Preferably, RIE+WCE etching under the "mild" conditions disclosed in the foregoing is used for that purpose.

Figure 11:
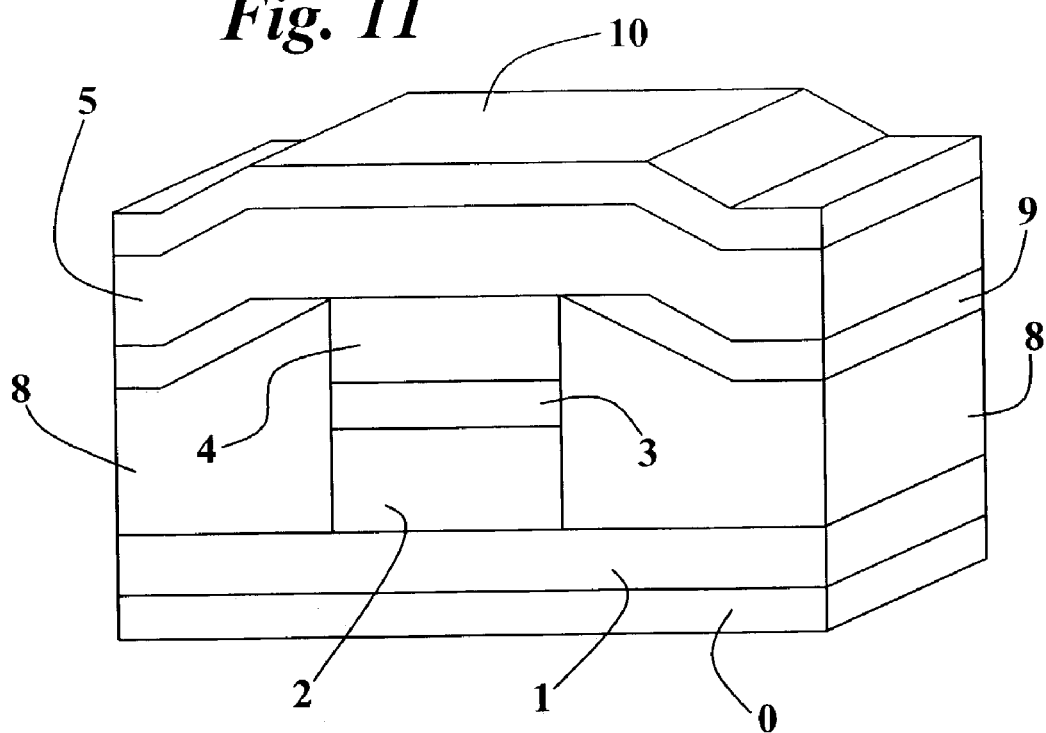
FIG. 11 is a cross sectional view showing lateral confinement layers growth, p-cladding and contact layer growth in an integrated opto-electronic device manufactured according to the invention.

While FIG. 10 (that is practically identical to FIG. 5) shows the results of butt-coupling passive waveguide MOCVD regrowth, the perspective view of FIG. 11 schematically shows the steps that follow the regrowth process as illustrated in FIG. 10, and a possible lateral definition of the mesa profile to a reduced width of e.g. 3–4 microns. These steps include regrowing a lateral confinement layer 8, followed by a n-InP blocking layer 9, a p-cladding 5 and a contact layer 10

Figure 12:
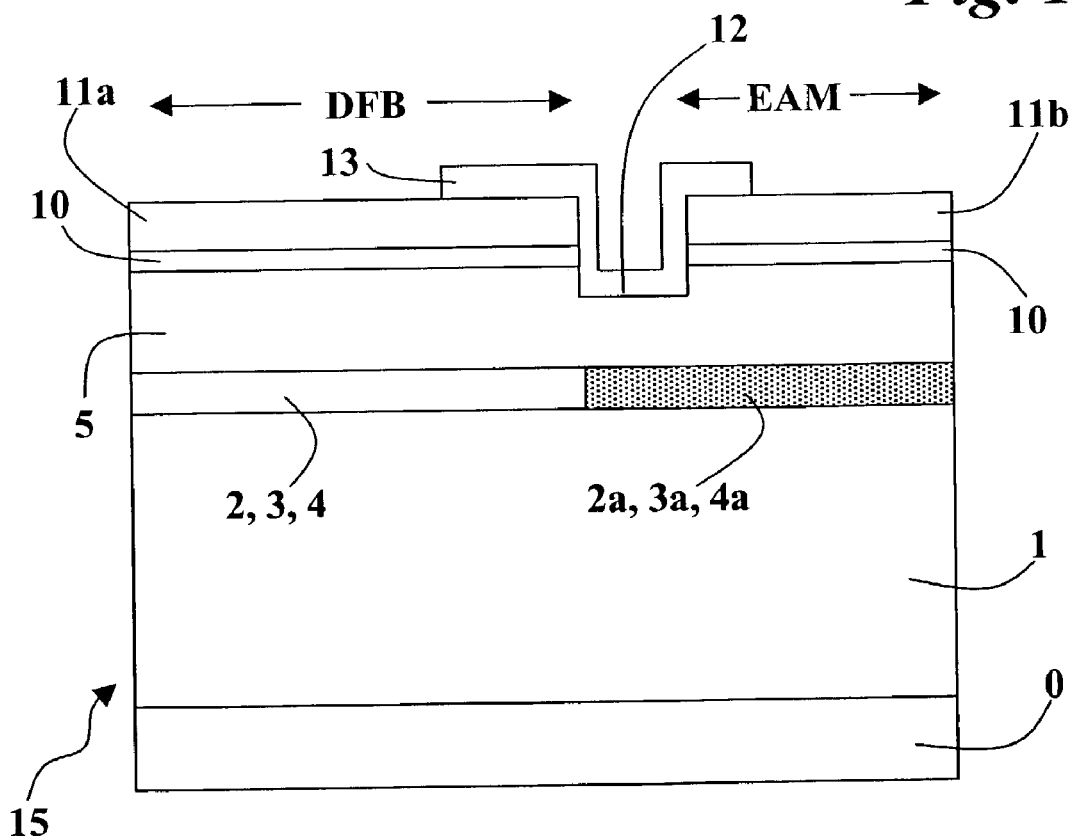
FIG. 12 shows electrode isolation in the longitudinal direction within the device of FIG. 11.

FIG. 12 shows electrodes 11a and 11b comprised of metals such as Ti/Pt/Au metals being deposited over the p-InGaAs layers 10 and a trench 12 passivated by a dielectric film 13 in order to insulate the two electrodes 11a and 11b that are finally intended to be associated with the active (DFB) and the passive (EAM) portions, respectively. These portions are the constituents parts of the integrated optoelectronic device 15 thus formed.

Figure 13:
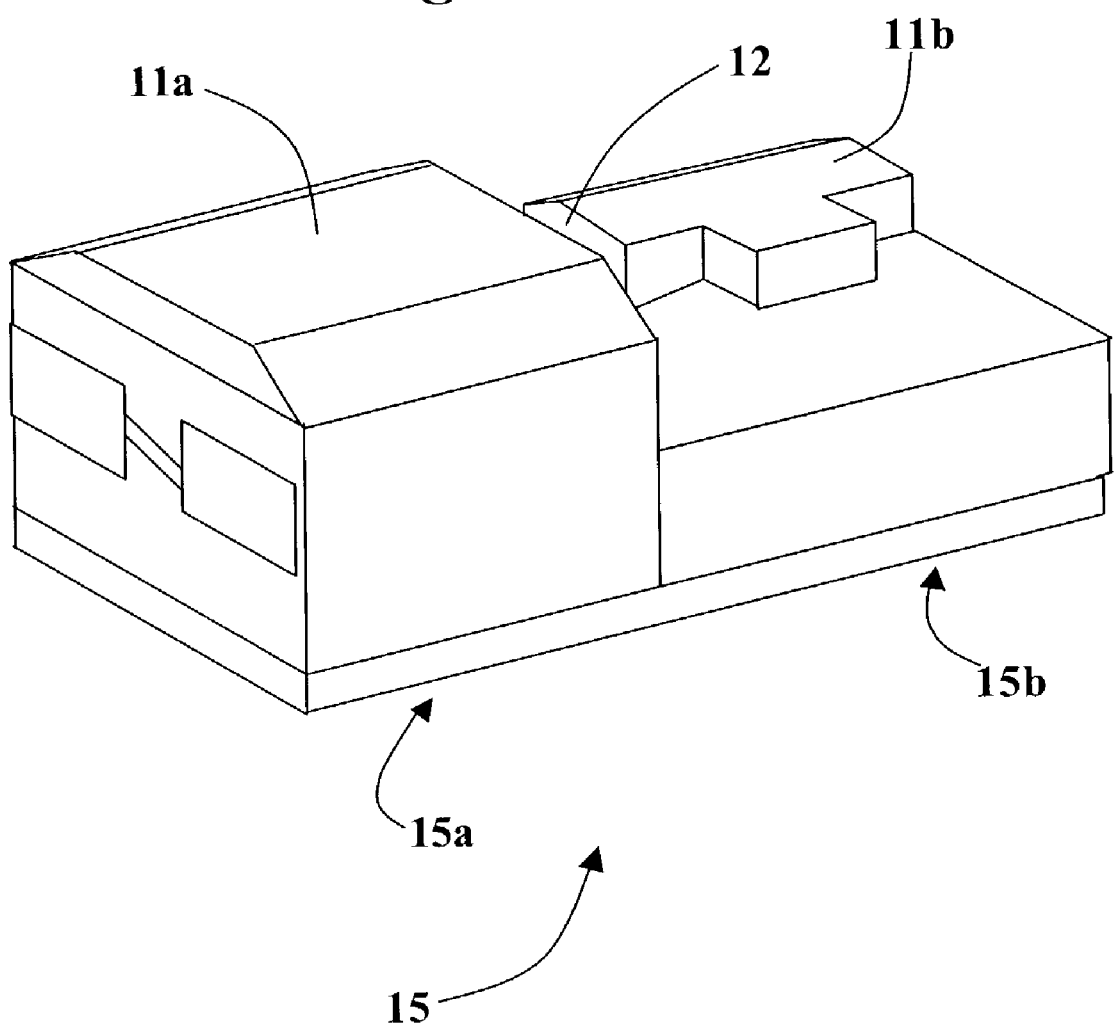
FIG. 13 shows the final steps in manufacturing the device of FIGS. 11 and 12.

Finally, the perspective view of FIG. 13 better highlights the final structure of such a device 15 including an active portion 15a and a passive portion 15b butt-coupled to each other.

Those of the skill in the art will of course appreciate that the specific quantitative data provided herein are to be understood and construed by taking into account the tolerances inherent in the corresponding methods of manufacture and/or measurement. Also, those quantitative data are evidently provided as exemplary of preferred embodiments of the invention and are in no way intended to limit the true spirit and scope of the present invention.

All of the above U.S. patents, U.S. patent application publications, U.S. patent applications, foreign patents, foreign patent applications and non-patent publications referred to in this specification are incorporated herein by reference, in their entirety.

The above description of illustrated embodiments of the invention, including what is described in the abstract, is not intended to be exhaustive or to limit the invention to the precise forms disclosed. While specific embodiments of, and examples for, the invention are described herein for illustrative purposes, various equivalent modifications are possible within the scope of the invention and can be made without deviating from the spirit and scope of the invention.

These and other modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A method of manufacturing integrated semiconductor devices, including the steps of:
    providing a layered semiconductor structure having an exposed surface,
    providing a mask on said exposed surface thereby defining a masked region of said layered structure underneath said mask; said mask having a main direction of extension with a width across said main direction and an end portion,
    etching said layered structure over a given depth starting from said exposed surface, whereby said masked region is left substantially unaffected by said etching and has an end surface forming a vertical sidewall extending underneath said end portion of said mask,
    growing a further layered semiconductor structure around said masked region to produce an integrated layered semiconductor structure having at said end surface an interface between said layered structure and said further grown structure where layers of the further layered semiconductor structure are butt-coupled to layers in the masked region, wherein said width is selected to be less than 50 microns.

2. The method of claim 1, wherein said width is selected to be less than 30 microns.

3. The method of claim 1, wherein said width is selected to be less than 20 microns.

4. The method of claim 1, wherein said width is selected to be less than 15 microns.

5. The method of claim 1, wherein said width is selected to be more than 1 micron.

6. The method of claim 1, wherein said width is selected to be more than 3 microns.

7. The method of claim 1, wherein said width is selected to be more than 5 microns.

8. The method of claim 1, wherein said width is selected to be more than 8 microns.

9. The method of claim 1, wherein said width is selected in the range between 8 and 15 microns.

10. The method of claim 1, including the step of providing over said exposed surface a plurality of masks thus defining respective masked regions of said layered structure underneath the masks of said plurality, wherein two adjacent masks in said plurality have a lateral separation length and said lateral separation length is selected to be higher than 200 microns.

11. The method of claim 1, including the step of providing over said exposed surface a plurality of masks thus defining respective masked regions of said layered structure underneath the masks of said plurality, wherein two adjacent masks in said plurality have a lateral separation length and said lateral separation length is selected to be substantially equal to 200 microns.

12. The method of claim 1, characterised in that said mask is a dielectric mask.

13. The method of claim 1, wherein said layered structure includes a base buffer layer opposite said exposed surface and wherein said etching is extended from said exposed surface within said base buffer layer.

14. The method of claim 13, characterised in that said etching is carried out by providing a smooth growth surface at said base buffer layer.

15. The method of claim 13, including the step of growing a respective buffer layer of said further grown structure over said base buffer layer, said respective buffer layer having a thickness between about 100 and about 200 nanometers.

16. The method of claim 1, wherein said etching is a combination of a reactive ion etching (RIE) and a wet chemical etch (WCE).

17. The method of claim 16, wherein said wet chemical etch is a chemical etch providing a nearly vertical sidewall beneath said end portion of said mask.

18. The method of claim 16, wherein said wet chemical etch is a 2:1:1:1 ($CH_3COOH$, $H_2O$, $H_2O_2$, HCl) 2', 10C etch.

19. The method of claim 16, characterised in that said etching is a reactive ion etching followed by a mild chemical etch.

20. A method of manufacturing integrated semiconductor devices, including the steps of:
    providing a layered semiconductor structure having an exposed surface, said layered structure including a base buffer layer opposite said exposed surface,
    providing a mask on said exposed surface thereby defining a masked region of said layered structure underneath said mask; said mask having a main direction of extension with a width across said main direction and an end portion,
    etching said layered structure over a given depth starting from said exposed surface into said base buffer layer, whereby said masked region is left substantially unaffected by said etching and has an end surface forming a vertical sidewall extending underneath said end portion of said mask to said base buffer layer,
    growing a further layered semiconductor structure around said masked region to produce an integrated layered semiconductor structure having at said end surface an interface between said layered structure and said further grown structure where layers of the further layered semiconductor structure are butt coupled to layers in the masked region, wherein said width is selected to be less than 50 microns.

21. The method of claim 20, characterised in that said etching is carried out by providing a smooth growth surface at said base buffer layer.

22. The method of claim 20, including the step of growing a respective buffer layer of said further grown structure over said base buffer layer.

23. The method of claim 22, wherein said respective buffer layer has a thickness between about 100 and about 200 nanometers.

24. A method of manufacturing integrated semiconductor devices, including the steps of:

providing a layered semiconductor structure having an exposed surface, providing a mask on said exposed surface thereby defining a masked region of said layered structure underneath said mask; said mask having a main direction of extension with a width across said main direction and an end portion, etching said layered structure over a given depth starting from said exposed surface, whereby said masked region is left substantially unaffected by said etching and has an end surface forming a vertical sidewall extending underneath said end portion of said mask, growing a further layered semiconductor structure around said masked region to produce an integrated layered semiconductor structure having at said end surface an interface between said layered structure and said further grown structure where layers of the further layered semiconductor structure are butt coupled to layers in the masked region, wherein said width is selected to be less than 50 microns and wherein said etching is a combination of a reactive ion etching (RIE) and a wet chemical etch (WCE).

25. The method of claim 24, wherein said wet chemical etch is a chemical etch providing a nearly vertical sidewall.

26. The method of claim 24, wherein said wet chemical etch is a 2:1:1:1 ($CH_3COOH$, $H_2O$, $H_2O_2$, HCl) 2', 10C etch.

27. The method of claim 24, wherein said etching is a reactive ion etching followed by a mild chemical etch.

28. A method of manufacturing integrated semiconductor devices, including the steps of:

providing a layered semiconductor structure having an exposed surface, providing a mask on said exposed surface thereby defining a masked region of said layered structure underneath said mask; said mask having a main direction of extension and an end portion, etching said layered structure over a given depth starting from said exposed surface, whereby said masked region is left substantially unaffected by said etching and has an end surface forming a vertical sidewall extending underneath said end portion, wherein said etch includes a chemical etch providing a nearly vertical sidewall beneath said end portion of said mask, growing a further layered semiconductor structure around said masked region to produce an integrated layered semiconductor structure having at said end surface an interface between said layered structure and said further grown structure where layers of the further layered semiconductor structure are butt coupled to layers in the masked region.

29. The method of claim 28, wherein said layered structure includes a base buffer layer opposite said exposed surface and said layered structure is etched from said exposed surface into said base buffer layer.

30. The method of claim 29, including the step of growing a respective buffer layer of said further grown structure over said base buffer layer.

31. The method of claim 30, wherein said respective buffer layer has a thickness between about 100 and about 200 nanometers.

32. The method of claim 28, wherein said etching is a combination of a reactive ion etching (RIE) and a wet chemical etch (WCE).

33. The method of claim 32, wherein said wet chemical etch is a 2:1:1:1 ($CH_3COOH$, $H_2O$, $H_2O_2$, HCl) 2', 10C etch.

34. The method of claim 28, wherein said etch is a reactive ion etching followed by a mild chemical etch.

* * * * *